(12) United States Patent
Hein

(10) Patent No.: US 6,909,246 B2
(45) Date of Patent: Jun. 21, 2005

(54) ELECTRONIC BALLAST AND ELECTRONIC TRANSFORMER

(75) Inventor: Peter Hein, Fraxern (AT)

(73) Assignee: TridonicAtco GmbH & Co. KG, Dornbirn (AT)

( * ) Notice: Subject to any disclaimer, the term of this patent is extended or adjusted under 35 U.S.C. 154(b) by 331 days.

(21) Appl. No.: 10/179,175

(22) Filed: Jun. 26, 2002

(65) Prior Publication Data

US 2003/0011319 A1 Jan. 16, 2003

Related U.S. Application Data

(63) Continuation of application No. PCT/EP00/13170, filed on Dec. 22, 2000.

(30) Foreign Application Priority Data

Dec. 27, 1999 (DE) ............................... 199 63 292

(51) Int. Cl.[7] ............................................. H05B 37/02
(52) U.S. Cl. ...................... 315/248; 315/224; 315/244; 315/291; 315/307
(58) Field of Search ............................ 315/209 R, 219, 315/224, 225, 244, 248, 291, 307, DIG. 7; 363/44, 45

(56) References Cited

U.S. PATENT DOCUMENTS

| | | | |
|---|---|---|---|
| 4,873,757 A | 10/1989 | Williams | 29/602 |
| 5,371,440 A | 12/1994 | Liu et al. | 315/209 |
| 5,677,602 A | * 10/1997 | Paul et al. | 315/224 |
| 5,714,846 A | * 2/1998 | Rasch et al. | 315/225 |
| 5,936,358 A | * 8/1999 | Okamoto et al. | 315/248 |
| 5,945,902 A | 8/1999 | Lipkes et al. | 336/200 |
| 5,949,191 A | 9/1999 | Cassese et al. | 315/82 |

FOREIGN PATENT DOCUMENTS

| | | |
|---|---|---|
| DE | 4126544 A1 | 2/1993 |
| EP | 0581206 A2 | 2/1994 |
| EP | 0690460 A1 | 1/1996 |
| WO | WO 9607297 A2 | 3/1996 |

* cited by examiner

*Primary Examiner*—Don Wong
*Assistant Examiner*—Jimmy T. Vu
(74) *Attorney, Agent, or Firm*—Fitzpatrick, Cella, Harper & Scinto

(57) ABSTRACT

An electronic ballast which includes a resonant load circuit (L1, C1) in series with a discharge lamp (LA), the resonant load circuit being supplied by an inverter (S1, S2) which outputs variable alternating voltages at frequencies above 200 KHZ. Alternatively, an electronic transformer incorporates a load circuit and a variable output frequency inverter for operating a low volt halogen lamp (7) at variable alternating frequencies above 200 KHZ. Passive components of the ballast and transformer are integrated into a multilayer circuit (13).

23 Claims, 4 Drawing Sheets

ELECTRONIC BALLAST AND ELECTRONIC TRANSFORMER

CROSS REFERENCE TO RELATED APPLICATIONS

This is a continuation of copending International Application No. PCT/EP00/13170, filed Dec. 22, 2000, which was published as WO 01/49083 on Jul. 5, 2002 in German but not in English, and the priority of which is hereby claimed.

BACKGROUND OF THE INVENTION

1. Field of the Invention

The invention relates to an electronic ballast for operating a discharge lamp that has electrodes and an electronic transformer for operating a low-volt halogen lamp.

2. Description of the Related Art

The designer of electronic ballasts cannot help thinking first of all of operating any ballast he is to design at the mains frequency, as the mains frequency is available. However, it proves to be the case here that relatively large components have to be selected. A consequence of this is that the ballast is not only expensive, but also that its rates of wear are still relatively great.

Ballast designers have therefore gone over very quickly to using higher frequencies for operating the ballasts, in order to be able to use components of smaller dimensions, with the result that the ballast became smaller and cheaper too. Although it is accepted in this regard that the mains voltage first has to be rectified and a higher-frequency alternating voltage has to be produced from the rectified mains voltage, the advantages described prevail however with regard to the additional expenditure caused thereby. An added advantage is namely the fact that the efficiency of low-pressure discharge lamps increases at higher frequencies.

The range between 20 and 50 kHz was previously regarded as optimum for the choice of starting and operating frequencies for electronic ballasts. This is because the interfering radiation that the ballasts emit on the one hand into the system and that is radiated on the other hand directly into the environment by the antenna effect of the lamp can still be controlled in this range. The permitted emission values are controlled by standards.

The frequency range of 20–50 kHz mentioned has also proved optimal in so far as the dimensions of the discrete components resulting therefrom are still large enough to be suitable for automatic assembly on circuit boards, although a certain stagnation in ballast development has set in due to the stated frequency range.

In contrast to electronic ballasts for gas-discharge lamps, electronic transformers for operating low-volt halogen lamps offer no advantage initially if purely the characteristics of low-volt halogen lamps are considered. However, advantages result from the possibilities yielded by the use of electronic circuits.

Thus, the dependence of the output voltage on the load and the mains voltage can be improved compared with conventional transformers even without expensive controllers. In addition, all the methods that are usual at present for dimming lamps can be used with electronic transformers. Finally, optimum operation can be achieved with the aid of a controlled system, regardless of the external conditions. This is interesting against the background that the luminous flux and life of low-volt halogen lamps are very strongly voltage-dependent.

In the same way as with electronic ballasts, a frequency range between 20 and 50 kHz has proved to be preferred in the development of electronic transformers to operate low volt halogen lamps also. Here, too, a certain stagnation in further development has set in over the course of time.

SUMMARY OF THE INVENTION

The object of the invention therefore is to break up the frequency limits previously considered optimum for electronic ballasts and electronic transformers and to take a new direction in development and in particular here in the miniaturization of these devices.

According to a first aspect of the invention, the object is achieved in that the inverter of an electronic ballast is operated henceforth at frequencies above 200 kHz for starting and during operation of the lamp, and that passive components of the ballast are integrated into a multilayer circuit. The inverter is preferably operated at frequencies above 1 MHz, in particular between 2.2 MHz and 3.0 MHz.

A substantial frequency jump has thus been made compared with the frequency range hitherto considered optimal, it not being self-evident that discharge lamps still operate perfectly at such high frequencies as far as their physical conditions are concerned. However, it has proved to be the case that the lamps not only operate at these frequencies; on the contrary, it has turned out that they can even be started more easily and that even efficiency can be increased still further. Furthermore, it has turned out that fears that a lamp operated at such high frequencies could give a person touching it a shock are inaccurate.

The use of such high frequencies in lamp operation is already known to some extent. U.S. Pat. No. 5,371,440 thus describes an electronic ballast in which the rectified mains supply voltage is first converted into a high-frequency alternating voltage with a frequency of 1–2 MHz and modulated in addition at a frequency of approx. 20 kHz. Before this alternating voltage is supplied to the lamp to be operated, it is admittedly smoothed further, so that the lamp is operated only at a frequency in the known range of approx. 20–50 kHz.

In a ballast known from WO 96/07297 A2 on the other hand, an alternating voltage at a frequency of 2.65 MHz is actually supplied to the load circuit. Special precautions are taken for the lamp operation, though. Thus a certain ratio that guarantees particularly effective operation is selected between the resonance frequency of the load circuit and the frequency of the inverter. In addition, this ballast is especially suitable for electrodeless lamps.

To minimize the radiation of electromagnetic high-frequency fields into the environment in the case of the high frequencies according to the invention, it is desirable to design the ballast compactly, as in this case shielding measures can be taken easily. However, due to the increase in operating frequency, the capacitance and inductance values of some of the components used in the ballast can be reduced such that instead of using discrete components, these components can be integrated according to the invention into a multilayer circuit. Passive components in particular such as resistors, capacitors, transformers or chokes are suitable for integration here, so that a marked reduction in the dimensions of the ballast as a whole can be achieved.

All types of discharge lamps can be used in this regard, e.g. conventional low-pressure discharge lamps, although so-called compact lamps, for example fluorescent lamps or high-pressure gas-discharge lamps with a cap on one side that have electrodes, are a preferred application example. These have the advantage that, owing to the cap on one side, the electrical leads can be formed markedly shorter than in the case of a lamp with a cap on two sides and the radiation can be reduced accordingly.

According to a second aspect of the present invention, the object is also achieved by an electronic transformer for operating a low-volt halogen lamp, the transformer having an inverter that is supplied with direct voltage and is variable in its output frequency and having a load circuit connected to the output of the inverter, which circuit contains at least one transformer and a low-volt halogen lamp connected to the secondary winding of the transformer. According to the invention, the inverter is again operated at frequencies above 200 kHz and passive components of the electronic transformer are integrated into a multilayer circuit.

As also in the case of the electronic ballast according to the invention, it is only due to the marked increase in operating frequency that the possibility is opened up of integrating parts of the electronic transformer and thus of designing this more compactly all in all. The inverter is preferably operated at a frequency above 1 MHz, particularly preferredly between 2.3 MHz and 3.0 MHz. This range is particularly advantageous in so far as the European standards permit increased noise radiation here.

Additional features of the invention are also described and claimed herein.

The integration of components can be achieved for example by multilayer circuit board technology. The multilayer circuit is preferably realized by an LTCC (Low Temperature Cofired Ceramic) structure, which consists of several low sintering ceramic layers or films arranged on top of one another, between which printed conductors are located. Compared with conventional circuit board technology, further miniaturization of the circuit can be achieved with this LTCC technique that has been newly developed in recent years. As well as printed conductors, inductors and capacitors in particular can also be integrated into the multilayer circuits. Furthermore, the ceramic material offers the advantage of conducting heat relatively well, meaning that greater outputs can be achieved with the same unit volume, as the heat loss is radiated better. The heat dissipation is preferably increased further by embedding the ceramic structure in a metal casing. Effective shielding of the high-frequency fields radiated into the environment by the ballast can also be achieved in this way. LTCC multilayer circuits of this kind are described in a general form in EP 0 581 206 A2 or U.S. Pat. No. 5,945,902.

At operating frequencies in the megahertz range, a majority of the components of the ballast can be integrated into the multilayer circuit, although the remaining passive components as well as some semiconductor assemblies still have to be mounted on the surface or outside the ceramic structure. To achieve the minimum space requirement for this also, the semiconductor assemblies are preferably mounted on the ceramic substrate by means of the flip-chip (FC) technique, known for example from EP 0 690 460 A1. In this case, a layer of synthetic material is applied between the semiconductor mounted without a casing and the contacts on the surface of the carrier substrate, which layer is electrically conductive perpendicular to the bonding plane and acts insulatingly in the bonding plane on the one hand and on the other hand takes up the tensions resulting from different thermal expansion of the semiconductor assembly and the ceramic substrate and thus prevents the destruction of the semiconductor assembly.

A compact ballast and a compact electronic transformer that facilitate reliable and safe operation of discharge lamps and low-volt halogen lamps owing to their properties are thus specified by the present invention.

BRIEF DESCRIPTION OF THE DRAWINGS

The invention is to be explained in greater detail below with reference to the enclosed drawings.

FIG. 4b is a section view taken along line I—I of FIG. 4a;

FIG. 5b is a view taken along line I—I of FIG. 5a;

DETAILED DESCRIPTION OF THE PREFERRED EMBODIMENTS

Figure 1:
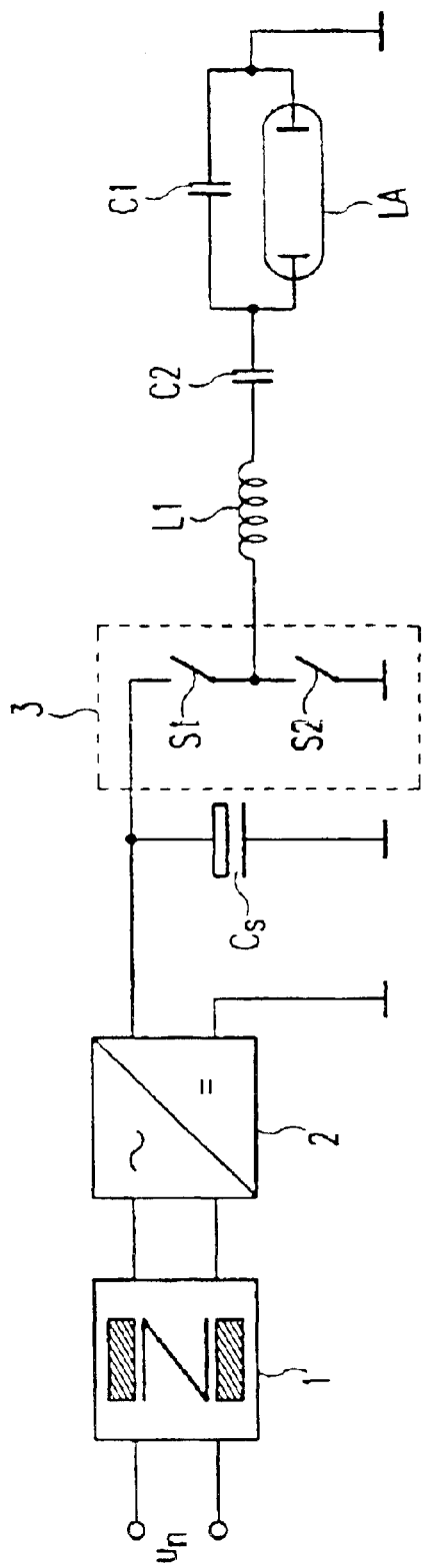
FIG. 1 is a block and circuit diagram which shows a circuit construction of an electronic ballast according to the invention for operating a discharge lamp.

FIG. 1 shows the typical operating circuit diagram of a simple electronic ballast. The input of the ballast connected to the mains alternating voltage $u_n$ is formed by a harmonic filter 1, which is intended as an interference suppression filter to limit the interference voltages arising due to the switching operations in the ballast and spreading to the supply system. Connected to the output of the harmonic filter 1 is a rectifier circuit 2 - for example a bridge rectifier or the like. To smooth the rectified mains alternating voltage $u_n$, an electrolytic capacitor $C_s$ acting as a storage capacitor is located between the positive output of the rectifier circuit 2 and the input of the inverter 3.

In the present example, the inverter 3 of the ballast is formed by a half-bridge of two series-connected electronic switches S1 and S2, it being possible for one switch respectively to consist of a MOS field-effect transistor. These two switches S1 and S2 are driven via a control circuit (not shown) such that one of the two switches S1 or S2 respectively is opened and the other is closed, the switching frequency lying above 200 kHz according to the invention, preferably above 1 MHz and particularly preferredly in the range between 2.2 and 3.0 MHz, for example at approx. 2.65 MHz.

Connected to the output of the inverter 3, i.e. at the common node of the two switches S1 and S2 is the load circuit containing the discharge lamp LA. This circuit consists of a series resonant circuit, composed of a reactor L1 and a resonance capacitor C1. Furthermore, a coupling capacitor C2 is disposed between the reactor L1 and the resonance capacitor C1. Connected to the connection node between the two capacitors C1 and C2 is one of the two cathodes of the discharge lamp LA, so that the lamp LA lies parallel to the resonance capacitor C1. The lamp LA can be a low-pressure discharge lamp, for example. Preferably it is a fluorescent lamp or high-pressure gas discharge lamp with a cap on one side and with electrodes, as in this case the radiation from the lamp is reduced.

The circuit design shown in FIG. 1 is already sufficiently known due to the conventional ballasts with which discharge lamps are operated in a frequency range between 20 kHz and 50 kHz and does not therefore have to be explained further. In particular, the inductance value of the reactor L1 and the capacitance values of the resonance capacitor C1 and the coupling capacitor C2 are considerably lower in the ballast according to the invention, however, than the corresponding values in a conventional ballast, owing to the high operating frequencies. The three passive components just named no longer have to be present as discrete components, therefore, but can be integrated into a multilayer circuit.

The circuit shown in FIG. 1 can easily be added to. Thus it would be conceivable, for example, to monitor the operating status of the lamp LA by means of suitable circuits that register the lamp current and the lamp voltage. Furthermore, it would be possible to preheat the lamp electrodes prior to starting the lamp LA by using a heating transformer. As already mentioned, though, the conventional gas-discharge lamps prove surprisingly to be extremely easy to start at the operating frequencies according to the invention, so that the use of suitable electrode heating for starting the lamp is not necessarily required.

Figure 2:
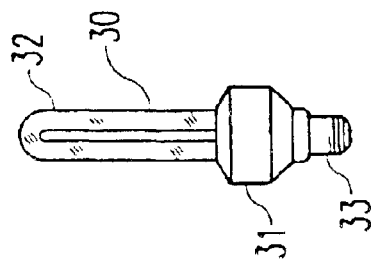
FIG. 2 is a side elevational view of a preferred practical example of a discharge lamp that is capped on one side.

FIG. 2 shows the preferred practical example of a lamp 30 that has electrodes and a cap on one side, which lamp is normally also described as a compact lamp. The main components of this compact lamp 30 are a base body 31, from which a U-shaped gas-discharge tube 32 extends in one direction and a cap 33 extends in the opposite direction.

The cap 33 is provided for take-up in a normal bulb socket, the electronic ballast is disposed inside the base body 31. Owing to the integration according to the invention of the passive components into a multilayer circuit, the dimensions of the ballast can be kept very small, so that this can be accommodated even in small base bodies.

A further advantage in the use of such a compact lamp 30 consists also in the fact that, owing to the cap on one side, the electric leads can be designed to be markedly shorter than on a lamp with a cap on two sides. Since the high-frequency alternating voltage is accordingly present only on one short cable section, the radiation is reduced in all. The contact lamp 30 with a cap on one side can be both a fluorescent lamp and a high-pressure gas-discharge lamp.

Figure 3:
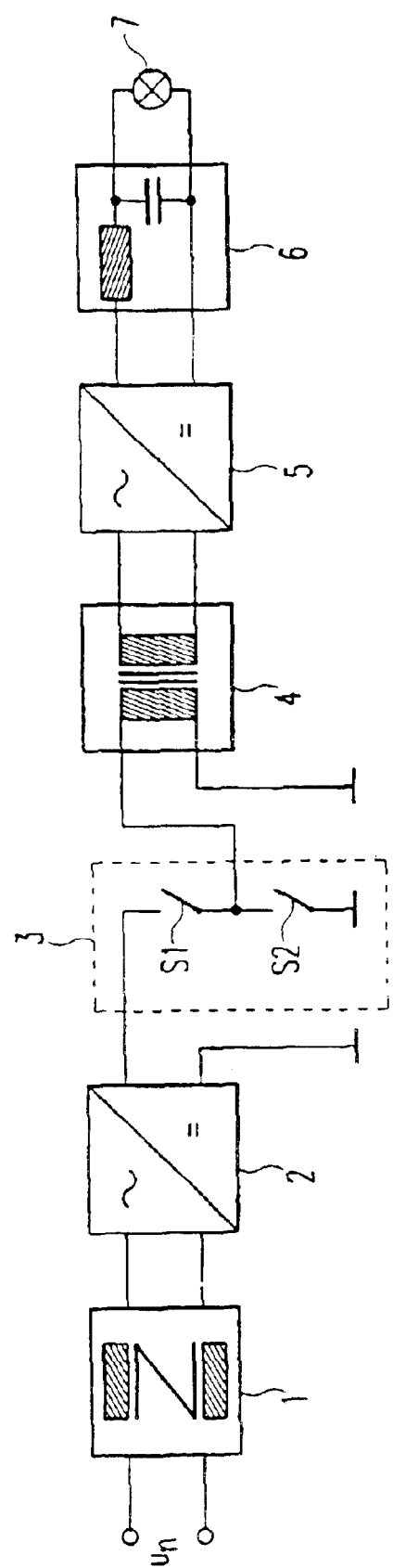
FIG. 3 is a block and circuit diagram which shows a circuit construction of an electronic transformer according to the invention for operating a low-volt halogen lamp.

As a practical example of the second aspect of the present invention, FIG. 3 shows the typical operating circuit diagram of an electronic transformer for operating a low volt halogen lamp, components that are identical to the components shown in FIG. 1 being provided with the same reference symbols. In the first instance, the electronic transformer also has a harmonic filter 1 for radio interference suppression that is connected on the input side to an alternating voltage source, which provides a supply alternating voltage $u_n$. Connected to the harmonic filter 1 is a rectifier circuit 2, which supplies the rectified supply alternating voltage it produces to an inverter 3, which again consists of two switches S1 and S2 arranged in a half-bridge circuit.

The switches S1, S2 are switched on and off alternately according to a defined scheme by a control circuit (again not shown), so that a voltage chopped into rectangular blocks thus results, which is modulated using the rectified mains voltage. The alternating voltage thus generated is transmitted by means of a transformer 4 to a load circuit on the output side and transformed into an extra-low voltage required for the low-volt halogen lamp 7 arranged in the load circuit. A further circuit 5 for rectifying is also located in the load circuit, as well as a filter 6 for smoothing the alternating voltage transmitted.

Again, the switches S1 and S2 of the inverter 3 are operated according to the invention at a frequency above 200 kHz, so that a marked reduction in the inductance and capacitance values of the passive components contained in the circuit is achieved and these can thus be integrated into a multilayer circuit. The frequencies lie preferably above 1 MHz, particularly preferredly in the range between 2.2 MHz and 3.0 MHz, for example at approx. 2.65 MHz. Additions to the circuit due to further monitoring circuits or control circuits for dimming the low-volt halogen lamp 7 can likewise be provided.

In the following it is intended to look at the structural layout of the ballast and the electronic transformer more closely. The LTCC multilayer circuit already mentioned presents itself in particular for the integration of the passive components. The production of a ceramic multilayer structure of this kind is now to be explained with reference to FIGS. 4a–9.

Figure 4A:
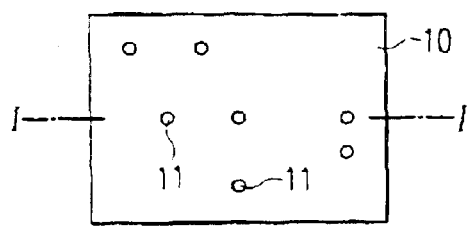
FIG. 4a is a top view of a ceramic film during a first step in the production of a multilayer ceramic structure according to the invention.
Figure 4B:
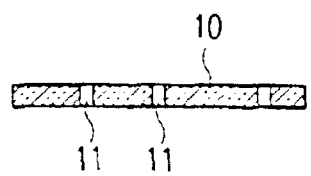
Figure 5A:
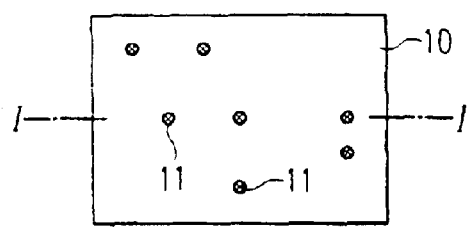
FIG. 5a is a view similar to FIG. 4a but showing the ceramic film during a second step in the production of a ceramic structure according to the invention.
Figure 5B:
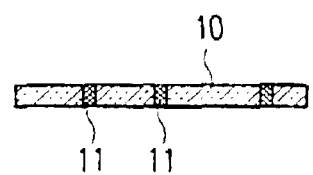

The basic module of an LTCC structure is formed by a low sintering ceramic film approx. 100–130 $\mu$m thick, for example of aluminum oxide, which is mixed with glass particles and further filler material, as shown in top view in FIG. 4a. The first processing step consists in punching plated-through holes 11 in the ceramic film 10. FIG. 4b shows the suitably processed ceramic film 10 in section I—I of FIG. 4a. Prior to the burning process, the diameter of the plated-through holes 11 is roughly 250 $\mu$m. In the next step, shown in FIGS. 5a and 5b, the plated-through holes 11 are then filled with a conductive material, normally with a conductor paste that contains a relatively high proportion of solid material.

Figure 6:
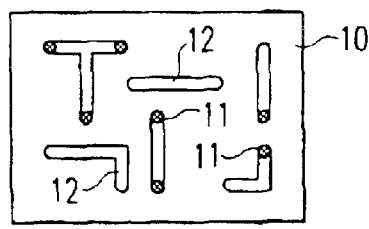
FIG. 6 is a view similar to FIG. 5a but showing the ceramic film during a third step in the production of a ceramic structure according to the invention.

According to the desired circuit structure, printed conductors 12 are then printed onto the upper side of the ceramic film 10 (FIG. 6). This is normally done by means of screen printing methods. Silver, silver/palladium, gold or copper pastes are used here for the plated-through holes and for the printed conductors. To prevent bending, the material composition of the conductor pastes is chosen such that these shrink on subsequent sintering to the same degree as the ceramic layers 10 themselves.

Figure 7:
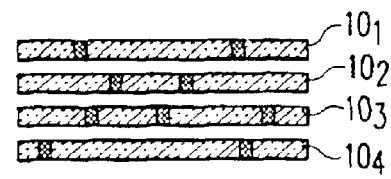
FIG. 7 is a section view of several ceramic films arranged for lamination according to a fourth step in the production of a ceramic structure according to the invention.
Figure 8:
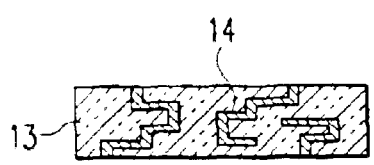
FIG. 8 is a cross-section of a completed ceramic structure according to the invention.

The processing steps just described are first carried out separately for each ceramic film 10. The individual layers of punched and printed ceramic films 10 are then arranged one on top of another and aligned, as shown in FIG. 7. They are then stacked in a press mold and laminated under the influence of heat and pressure, so that a continuous ceramic structure is formed. This is finally sintered to give a high-strength ceramic structure, a homogeneous ceramic substrate 13 being formed with a continuous system of printed conductors 14 integrated therein, as shown in FIG. 8.

Figure 9:
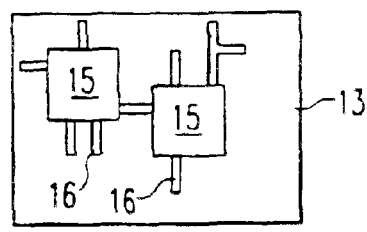
FIG. 9 is a top view of the ceramic structure shown in FIG. 8 with other components mounted thereon.

In the concluding processing step shown in FIG. 9, the components that cannot be integrated into the ceramic structure, for example various semiconductor assemblies 15 as well as the electrolytic capacitor $C_s$ shown in FIG. 1, are mounted on the upper side of the ceramic substrate 13 and bonded. Printed conductors 16 can also be mounted subsequently on the upper side. Finally, the entire complex is provided with terminal connections and enclosed by a metal casing, which increases heat dissipation on the one hand and on the other hand shields the high-frequency electromagnetic fields arising during operation.

Figure 10:
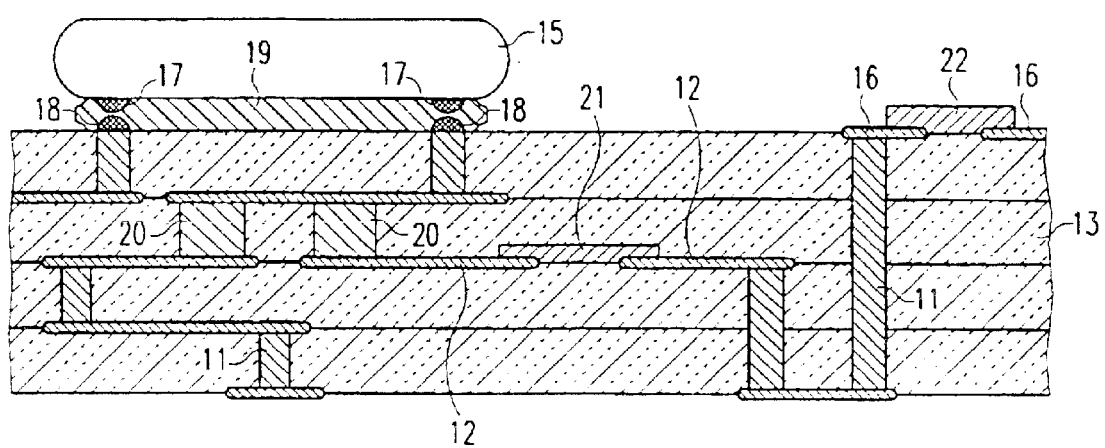
FIG. 10 is an enlarged fragmentary section view taken thorough the structure of FIG. 9.

FIG. 10 shows an area of the LTCC structure in section once again in an enlarged representation. The separating lines between the individual original ceramic layers are still drawn in here, even if, as described previously, a homogeneous ceramic structure 13 is formed following laminating and sintering. As can be seen on the right-hand side of the illustration, the conductors 11 running vertically here that are formed by the plated-through holes punched out in the first method step can extend even over several levels. The basic advantage of using an LTCC structure consists in the fact that not only conductors 11 and 12 but also other passive components can be integrated into the multilayer circuit. As well as the conductor paste for the general conductors 12, other materials of a defined conductivity for example can also be applied to the upper side of a single ceramic layer 10 in the context of the processing step shown in FIG. 6, so that a resistor 21 can be fully integrated into the ceramic structure 13 in this way. In addition to the normal plated-through holes 11, even larger holes running vertically can be punched in a ceramic layer 10, for example. These can then be filled with a material 20 with a certain dielectric constant, so that due to the conductor—dielectric 20—conductor layer arrangement shown in FIG. 10, integrated capacitors can be realized in the ceramic substrate 13. For example, the resonance capacitor C1 and the coupling capacitor C2 shown in FIG. 1 can be integrated into the multilayer circuit 13 in this way.

Integration of the resonance reactor L1 shown in FIG. 1, which would likewise be conceivable, is not shown. For example, an inductor could be realized inside the ceramic structure 13 by a spiral-shaped conductor printed onto a single ceramic layer 10, although it would also be conceivable to distribute the various windings of the inductor to several conductor planes. Structures of this kind are also described as planar inductors. To increase the inductance, an opening or recess could also be provided in the ceramic substrate 13 and filled with a suitable core material, for example ferrite. The integration of inductors in particular can again bring about a marked reduction in the size of the ballast and the electronic transformer as a whole.

Only inductance and capacitance values up to a certain level can be achieved for components integrated into the multilayer circuit, although these values are adequate for proper operation of the ballast and the electronic transformer at the frequencies according to the invention.

Not all components can be integrated into the multilayer circuit 13 with LTCC technology, though. For example, an electrolytic capacitor must continue to be used as a discrete component for the storage capacitor $C_s$. This is then mounted following sintering of the ceramic substrate 13 on the surface of this. Resistors 22 or inductors can naturally also be mounted on the surface in the same manner. Control circuits in particular for driving the two switches S1 and S2 of the inverter and any monitoring circuits are essentially formed by semiconductor assemblies 15, which cannot be integrated into the ceramic layer 13. Such semiconductor assemblies 15 are then preferably bonded on the upper side of the multilayer circuit 13 by means of flip-chip technology. Here an anisotropically electrically conductive synthetic material that is electrically conductive perpendicular to the flip-chip bonding plane and acts insulatingly in the bonding plane is inserted between the upper side of the ceramic substrate 13 and the uncased semiconductor circuit 15. As electrically conductive particles the synthetic material contains irregularly shaped pieces of metal, for example, or also smaller balls or fibers, which cause bonding between the surface contacts 18 of the ceramic substrate 13 and the terminal pads 17 of the semiconductor assembly 15. Furthermore, this synthetic material 18 also takes up tensions that may result from the different thermal expansion of the ceramic material and the semiconductor assembly 15. This flip-chip technology facilitates a very high bonding density, so that it likewise contributes to a reduction in the volume of the ballast as a whole.

Thus a concept has been introduced for an electronic ballast and an electronic transformer, with which conventional low-pressure discharge lamps, fluorescent lamps and high-pressure gas-discharge lamps and low-volt halogen lamps can be operated with a high level of efficiency and which can also be realized in a very compact form. This compact form in turn offers the possibility of taking suitable shielding measures against the electromagnetic fields occurring at the high frequencies.

The widespread reservations that operation of discharge lamps that have electrodes at the maximum frequencies according to the invention is very dangerous or even impossible have proved to be unfounded. In addition, it has turned out surprisingly to be the case that the conventional discharge lamps can not only be operated without difficulties at these high frequencies, but can possibly also be started considerably more simply than was known hitherto, so that a simplified circuit design is also conceivable.

What is claimed is:

1. An electronic ballast for operating a discharge lamp having electrodes, said electronic ballast comprising:
   an inverter which when supplied with direct voltage produces a variable frequency at an output thereof; said inverter being operable at frequencies above 200 KHZ for starting and operating a discharge lamp;
   a load circuit connected to the output of the inverter, said load circuit including at least one series resonant circuit which is connectable to a discharge lamp for operation by said inverter, and
   at least one multilayer circuit into which passive components of the ballast are integrated.

2. The electronic ballast according to claim 1, wherein said multilayer circuit is an LTCC multilayer circuit having sintered ceramic layers.

3. The electronic ballast according to claim 1 or claim 2, wherein said inverter is arranged to be operated at frequencies above 1 MHZ for starting and operating said discharge lamp.

4. The electronic ballast according to claim 1, wherein said load circuit includes at least one of a fluorescent lamp and a high-pressure gas-discharge lamp that has a cap and electrodes.

5. The electronic ballast according to claim 1, wherein said inverter is operable in a frequency range between 2.2 MHZ and 3.0 MHZ.

6. The electronic ballast according to claim 1, wherein chokes in the form of planar inductors are integrated into said multilayer circuit.

7. The electronic ballast according to claim 1, wherein said multilayer circuit comprises a plurality of circuit boards arranged one on top of another, said circuit boards having printed conductors on at least one side thereof and holes extending therethrough which are plated through with conductive material to connect different ones of said conductors which are in different planes.

8. The electronic ballast according to claim 1, wherein said multilayer circuit is encased by a metal casing.

9. The electronic circuit according to claim 1, wherein said multilayer circuit is connectable to at least one semiconductor assembly by means of flip-chip technology.

10. An electronic ballast for operating a low-pressure discharge lamp having electrodes, said electronic ballast comprising:
   an inverter which when supplied with direct voltage produces a variable frequency at an output thereof;
   a load circuit connected to the output of the inverter, said load circuit including at least one series resonant circuit which is connectable to a discharge lamp for operation by said inverter, and
   at least one LTCC multilayer circuit having sintered ceramic layers into which passive components of the ballast are integrated.

11. The electronic ballast according to claim 10, wherein said inverter is operable at frequencies above 1 MHZ.

12. The electronic ballast according to claim 10, wherein said inverter is operable in a frequency range between 2.2 MHZ and 3.0 MHZ.

13. The electronic ballast according to claim 10, wherein chokes in the form of planar inductors are integrated into said multilayer circuit.

14. The electronic ballast according to claim 10, wherein said multilayer circuit comprises a plurality of circuit boards arranged one on top of another, said circuit boards having printed conductors on at least one side thereof and holes extending therethrough which are plated through with conductive material to connect different ones of said conductors which are in different planes.

15. The electronic ballast according to claim 10, wherein said multilayer circuit is encased by a metal casing.

16. The electronic circuit according to claim 10, wherein said multilayer circuit is connectable to at least one semiconductor assembly by means of flip-chip technology.

17. An electronic transformer for use in a load circuit for operating a low voltage halogen lamp, said load circuit being connected to an output of an inverter which can be supplied with direct voltage and which produces a variable frequency above 200 KHZ at said output, said electronic transformer comprising:
   a primary winding;
   a secondary winding that is connectable to a low-voltage halogen lamp for operation by said inverter; and
   an LTTC multilayer circuit with sintered ceramic layers into which passive components of said transformer are integrated.

18. Electronic transformer according to claim 17, wherein said transformer is operable at frequencies above 1 MHZ.

19. The electronic transformer according to claim 17, wherein said transformer is operable in a frequency range between 2.2 MHZ and 3.0 MHZ.

20. The electronic transformer according to claim 17, chokes in the form of planar inductors are integrated into said multilayer circuit.

21. The electronic transformer according to claim 17, wherein said multilayer circuit comprises a plurality of circuit boards arranged one on top of another, said circuit boards having printed conductors on at least one side thereof and holes extending therethrough which are plated through with conductive material to connect different ones of said conductors which are in different planes.

22. The electronic transformer according to claim 17, wherein said multilayer circuit is encased by a metal casing.

23. The electronic transformer according to claim 17, wherein said multilayer circuit is connectable to at least one semiconductor assembly by means of flip-chip technology.

* * * * *